(12) United States Patent
Wang (10) Patent No.: US 10,666,307 B2
(45) Date of Patent: May 26, 2020

(54) COMPACT MODEL NONLINEAR COMPENSATION OF BANDLIMITED RECEIVER SYSTEMS

(71) Applicant: Massachusetts Institute of Technology, Cambridge, MA (US)

(72) Inventor: Xiao-Yu Wang, Watertown, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/041,060

(22) Filed: Jul. 20, 2018

(65) Prior Publication Data

US 2019/0028131 A1 Jan. 24, 2019

Related U.S. Application Data

(60) Provisional application No. 62/534,997, filed on Jul. 20, 2017.

(51) Int. Cl.
| | |
|---|---|
| *H04B 1/10* | (2006.01) |
| *H04L 25/03* | (2006.01) |
| *H03H 21/00* | (2006.01) |
| *H03M 1/10* | (2006.01) |
| *H03H 17/02* | (2006.01) |

(Continued)

(52) U.S. Cl.
CPC ........... *H04B 1/10* (2013.01); *H03H 17/0261* (2013.01); *H03H 21/0012* (2013.01); *H03M 1/0626* (2013.01); *H03M 1/1033* (2013.01); *H04L 25/03261* (2013.01); *H03M 1/12* (2013.01)

(58) Field of Classification Search
CPC ..... H04B 1/123; H04B 1/10; H04L 25/03261; H03H 17/0261; H03H 21/0012; H03M 1/0614; H03M 1/0626; H03M 1/1033
See application file for complete search history.

(56) References Cited

U.S. PATENT DOCUMENTS 7,142,835 B2 11/2006 Paulus
7,609,759 B2 10/2009 Raz et al.
(Continued)

FOREIGN PATENT DOCUMENTS

GB 2 345 230 A 6/2000

OTHER PUBLICATIONS

PCT International Search Report and Written Opinion dated Oct. 30, 2018 for International Application No. PCT/US2018/043046; 16 Pages.

(Continued)

*Primary Examiner* — Aristocratis Fotakis
(74) *Attorney, Agent, or Firm* — Daly, Crowley, Mofford & Durkee, LLP (57) ABSTRACT

A nonlinear compensator is provided to include a decomposition circuit and a plurality of filter elements. The decomposition circuit has a nonlinear frequency response characteristic and the decomposition circuit is configured to receive an input signal and decompose the input signal into decomposed signals corresponding to positive and negative frequency signal components of the input signal. Each of the plurality of filter elements is configured to receive at least portions of the decomposed signals and apply filter element characteristics to the decomposed signals with the filter element characteristics that are matched to the nonlinear frequency response of the decomposition circuit.

18 Claims, 10 Drawing Sheets

(51) Int. Cl.
*H03M 1/06* (2006.01)
*H03M 1/12* (2006.01)

(56) References Cited

U.S. PATENT DOCUMENTS

| | | | |
|---|---|---|---|
| 7,796,068 B2 | 9/2010 | Raz et al. | |
| 2002/0156820 A1* | 10/2002 | Kishi | H03H 17/0275 708/300 |
| 2003/0072393 A1 | 4/2003 | Gu | |
| 2004/0029550 A1* | 2/2004 | Kishi | H04L 27/364 455/323 |
| 2004/0164791 A1* | 8/2004 | Batruni | H03H 17/0261 327/552 |
| 2005/0219089 A1* | 10/2005 | Batruni | H03F 1/32 341/118 |
| 2006/0256216 A1 | 11/2006 | Takahiko et al. | |
| 2009/0086863 A1* | 4/2009 | Komninakis | H04B 1/10 375/346 |
| 2012/0146699 A1* | 6/2012 | Caron | H04B 1/109 327/231 |
| 2012/0213317 A1 | 8/2012 | Hsu | |
| 2013/0310090 A1* | 11/2013 | Bevan | H04B 1/1027 455/501 |
| 2014/0030995 A1* | 1/2014 | Kim | H04B 1/10 455/295 |
| 2015/0032788 A1* | 1/2015 | Velazquez | H04L 27/265 708/819 |
| 2015/0146820 A1* | 5/2015 | Winiecki | H03F 1/3258 375/296 |
| 2016/0087604 A1* | 3/2016 | Kim | H03H 17/0261 708/304 |
| 2016/0142229 A1* | 5/2016 | Bevan | H04B 17/0085 455/307 |

OTHER PUBLICATIONS

Crols et al., "A Single-Chip 900 MHz CMOS Receiver Front-End with a High Performance Low-IF Topology;" Proceedings of the IEEE Journal of Solid-State Circuits, vol. 30, No. 12; Dec. 1995; 10 Pages.

Crols et al., "Low-IF Topologies for High-Performance Analog Front Ends of Fully Integrated Receivers;" Proceedings of the IEEE Transactions on Circuits and Systems—II: Analog and Digital Signal Processing, vol. 45, No. 3; Mar. 1998; 14 Pages.

Goodman et al., "Polyphase Nonlinear Equalization of Time-Interleaved Analog-to-Digital Converters;" IEEE Journal of Selected Topics in Signal Processing, vol. 3, No. 3; Jun. 2009; 12 Pages.

Morgan et al., "A Generalized Memory Polynomial Model for Digital Predistortion of RF Power Amplifiers;" IEEE Transactions on Signal Processing, vol. 54, No. 10; Oct. 2006; 9 Pages.

Wang et al., "Nonlinear Compensator Identification and Synthesis through Higher Order Frequency Response;" MIT Lincoln Laboratory; 12 Pages.

* cited by examiner

FIG. 1
(Conventional Model)

COMPACT MODEL NONLINEAR COMPENSATION OF BANDLIMITED RECEIVER SYSTEMS

CROSS-REFERENCE TO RELATED APPLICATIONS

This application claims the benefit of Provisional Application No. 62/534,997 filed Jul. 20, 2017, and entitled "COMPACT MODEL NONLINEAR COMPENSATION OF BANDLIMITED RECEIVER SYSTEMS," which application is hereby incorporated herein by reference in its entirety.

GOVERNMENT RIGHTS

This invention was made with Government support under Contract No. FA8702-15-D-0001 awarded by the United States Air Force. The Government has certain rights in the invention.

TECHNICAL FIELD

This disclosure generally relates to a compensator architecture and more particularly to a compensator architecture with a decomposing circuit and a plurality of filter elements.

BACKGROUND

Linearity is a fundamental requirement in many modern radio systems. It enables the application of increasingly more sophisticated digital signal processing algorithms to increase available data-rates and channel capacity in commercial wireless applications. Furthermore, there exists a relationship between linearity and the ability to apply digital signal processing (DSP) techniques to signals being processed in a radio system. Briefly, the more linear an RF receiver, the higher the level of sophistication which may be used to digitally process the signals. The ability to apply sophisticated DSP techniques is desirable since it leads to increases in available data-rates and channel capacity in applications such as commercial wireless applications.

Linearity is also an important metric in the radar and signal intelligence application space. Thus, as trends towards use of increasingly more advanced algorithms to increase performance in radio systems, linearity becomes correspondingly more important.

At the same time, complementary metal oxide semiconductor (CMOS) scaling poses tremendous difficulties to traditional analog methods of improving system linearity. Available analog dynamic range is limited due to decreasing voltage supplies in modern CMOS as well as the degradation of transistor analog characteristics with each passing generation, making linearity improving circuits such as op-amps, for example, harder to implement with adequate performance. However, since scaling also makes digital circuitry less expensive and more powerful, it becomes meaningful to explore digital nonlinearity compensation as a means to recover at least some performance lost due to nonlinearity of analog circuitry.

Digital receive-side nonlinear compensation has recently become of interest in applications demanding high dynamic range. Some receivers include an analog-to-digital converter (ADC) to quantize an analog signal at an output of the receiver. Thus, if nonlinear distortion introduced by the receiver and ADC can be predicted and recreated based upon observed sampled output via an appropriate nonlinear model, then this recreated distortion can be subtracted away from the original digitized data stream, leading to a corrected output having significantly lower nonlinearity induced distortion.

In bandlimited receiver systems, strong frequency selectivity is required. Thus, such systems include very sharp bandwidth-defining elements such as input band-select filters and intermediate frequency (IF) or baseband filters. Introducing these bandpass elements leads to significant increases in the complexity of a nonlinear compensator. It would therefore, be desirable to provide an efficient technique to deal with this effect in order to satisfactorily implement the digital nonlinearity correction concept.

SUMMARY

The concepts, systems, and techniques disclosed herein are directed toward a compensator architecture decomposing an input digital into a positive and negative frequency signal component and applying characteristics of filter elements matched to the nonlinear frequency response of the decomposing to the decomposed signals.

According to one illustrative embodiment, a nonlinear compensator may include a decomposition circuit and a plurality of filter elements. The decomposition circuit may have a nonlinear frequency response characteristic and the decomposition circuit may be configured to receive an input signal and decompose the input signal into decomposed signals corresponding to positive and negative frequency signal components of the input signal. Each of the plurality of filter elements may be configured to receive at least portions of the decomposed signals and apply filter element characteristics to the decomposed signals with the filter element characteristics that are matched to the nonlinear frequency response of the decomposition circuit.

In one variation of the illustrative embodiment, the plurality of filter elements may be configured to reduce the number of tones to characterize the nonlinear system.

In one variation of the illustrative embodiment, the plurality of filters may comprise at least one of at least one nonlinear operation element or at least one linear operation filter.

In one variation of the illustrative embodiment, the at least one nonlinear operation element may comprise at least one static nonlinear mathematical operation element.

In one variation of the illustrative embodiment, the at least one linear operation filter may comprise at least one of at least one static linear filter or at least one adaptive linear filter.

In one variation of the illustrative embodiment, the decomposition circuit may comprise at least one long memory filter. In some embodiments, the long memory filter is a Hilbert filter to decompose the input signal into the decomposed signals. In other embodiments, the decomposition circuit may further comprise a down-conversion circuit including at least one long memory filter having a low pass filter characteristic to decompose the input signal into the decomposed signals. Herein, the decomposition circuit may further comprise a decimator.

In one variation of the illustrative embodiment, the decomposed signals may be interpolated by a fractional factor F, where F is a fraction greater than 1. In addition, the decomposed signals may be decimated by a fractional factor F, where F is a fraction greater than 1.

According to another illustrative embodiment, a method for compensating signals may include the steps of receiving an input signal and decomposing, by a decomposition circuit having a nonlinear frequency response characteristic, the input signal into decomposed signals corresponding to positive and negative frequency signal components of the input signal. The method may further include receiving at least portions of the decomposed signals, by a plurality of filter elements, wherein the characteristics of the plurality of filter elements are matched to the nonlinear frequency response characteristic of the decomposition circuit and applying the characteristics of each of the plurality of filter elements to the decomposed signals.

One variation of the illustrative method may further include the step of reducing the number of tones to characterize the nonlinear system by the plurality of filter elements.

One variation of the illustrative method may further include the step of interpolating the decomposed signals by a fractional factor F, wherein F is a fraction greater than 1. In addition, the method may further include decimating the decomposed signals by a fractional factor F, where F is a fraction greater than 1.

According to yet another illustrative embodiment, a receiver system may include: a continuous-time nonlinear system that processes an input signal and produces an intermediate signal, wherein the intermediate signal is a digital signal; a decomposition circuit configured to receive the intermediate signal and having a nonlinear frequency response characteristic to an input signal provided thereto, said decomposition circuit configured to decomposes an input signal provided thereto into decomposed signals corresponding to positive and negative frequency signal components of the input signal; and a plurality of filter elements each of which is configured to receive at least portions of the decomposed signals and apply filter element characteristics to the decomposed signals with the filter element characteristics being matched to the nonlinear frequency response of the decomposition circuit.

In one variation of the illustrative embodiment, the continuous-time nonlinear system may comprise input circuitry, a device-under-test, and output circuitry.

In one variation of the illustrative embodiment, the input circuitry may comprise an input driver, a power combiner, a balun, or a filter. In addition, the output circuitry may comprise an output filter or an Analog-to-digital converter (ADC).

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

The foregoing features may be more fully understood from the following description of the drawings in which.

DETAILED DESCRIPTION

All relative descriptions herein, such as left, right, up, and down, are with reference to the Figures, and not meant in a limiting sense. Additionally, for clarity, common items and circuitry, such as integrated circuits, resistors, capacitors, transistors, and the like, have not been included in the Figures, as can be appreciated by those of ordinary skill in the pertinent art.

Unless otherwise specified, the illustrated embodiments may be understood as providing example features of varying detail of certain embodiments, and therefore, unless otherwise specified, features, components, modules, elements, and/or aspects of the illustrations can be otherwise combined, interconnected, sequenced, separated, interchanged, positioned, and/or rearranged without materially departing from the disclosed concepts, systems, or methods. Additionally, the shapes and sizes of components are intended to be only illustrative and unless otherwise specified, can be altered without materially affecting or limiting the scope of the concepts sought to be protected herein.

The concepts, systems and techniques described herein are directed toward compensator structures for systems having fixed bandpassing elements. In accordance with the concepts, systems and techniques described herein, it has been found that splitting a signal into its positive and negative frequency components and applying a cascade of linear filters, static nonlinearities, and linear filters having selected characteristics results in equalizer structures which are more efficient than prior art to create equalizer structures.

Figure 1:
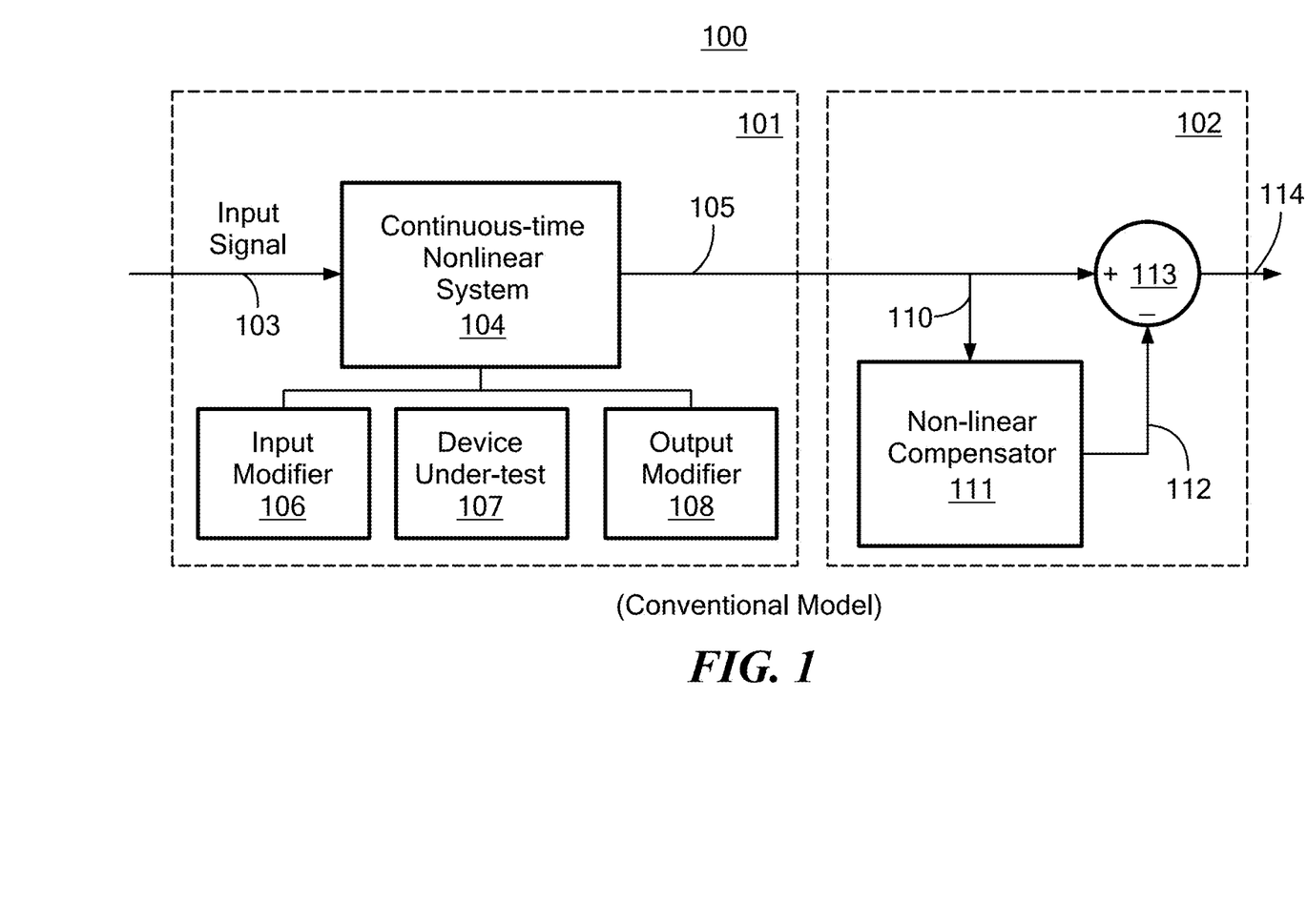
FIG. 1 is a block diagram of a generic model of nonlinear compensation.

Referring now to FIG. 1, a generic model of nonlinear compensation may include continuous-time portion 101 and discrete-time portion 102. The intermediate signal 105 from a continuous-time nonlinear system 104 is to be compensated digitally by a discrete time compensator 111. The continuous-time nonlinear system 104 may include a device-under-test (DUT) 107 that equalizes the input continuous signal, input circuitry that may include any input drivers, power combiners, baluns, or filters, and output circuitry that may include any output filters, analog-to-digital converter (ADC) that samples and hold frequency response and ADC nonlinearity. The input signal 103 is converted into a digital signal as the input signal is processed by the continuous-time nonlinear system 104. Accordingly, the intermediate signal 105 is a digital signal. The intermediate signal 105 from the continuous-time nonlinear system 104 may be compensated by a nonlinear compensator 111. The intermediate signal 105 may sample the signal after distortion of the DUT 107 and ADC in the output modifiers 108. The nonlinear compensator 111 may compensate the distorted to signal to generate output signal 114 that has less nonlinear distortion than the intermediate signal 105.

Two challenges are significant for this problem. For many applications in receive side compensation, the signal statistics are truly unknown, thus nonlinear compensator 111 must be a generic model that works for all input conditions. This requirement may have conflict with the requirement in Digital Pre-Distortion (DPD), where the overriding concern is with adjacent channel power ratio (ACPR) so that it is acceptable to have the very non-physical situation of different compensator coefficients for different input signals (e.g. WCDMA vs LTE) or even power levels. The second challenge is the fidelity requirement. Since the compensator is a canceller, it reduces distortion via subtraction, whereas most linearity metrics are measured in dB. As a result, an equalizer must be 90% accurate to improve linearity 20 dB, and 99% accurate to improve linearity by 40 dB. Furthermore, as the characteristics of the continuous-time nonlinear system 104 changes due to configuration, temperature, supply, aging, etc., the equalizer must also accurately track it in order to maintain performance.

For the problem represented in FIG. 1, the dominant method of implementing a nonlinear compensator involves using a discrete time representation of a Volterra series model and then modifying or "pruning" the coefficients. The Volterra series is a generic model of nonlinearity that is capable of representing any weakly nonlinear system with fading memory. It also has the desirable characteristic of being linear in coefficients, which makes it pair very well with existing least squares based methods of adaptive filters. One drawback of a Volterra model is that it has many degrees of freedom and the number of parameters to fit increases super-linearly as the memory of the system increase. Several approaches to basis reduction has been described in the literature, such as using a subset of the Volterra kernel. This subset may involve individual kernel elements, lines, or cubes of coefficients as well as more exotic subsets such as generalized memory polynomials or dynamic deviation. The basis space may be further pruned by methods such as greedy algorithms or picking the largest values. These methods can lead to satisfactory results, but create inefficient models where potentially many hundreds of independent coefficients are used to fit a nonlinearity that is physically created through far simpler mechanisms with much fewer degrees of freedom.

Other alternative approaches that have been recently explored involve neural networks, which execute a cascaded identification procedure involving cascades of linear filters and memoryless nonlinearities. These approaches have similar drawbacks to the Volterra coefficient based methods in that it is a "black box" approach and the result may have little physical correspondence to the system. Due to the lack of physical correspondence, systems identified with one input type may fail to generalize to other input types.

To address the limitations above mentioned, described herein is an illustrative embodiment of a nonlinear compensator according to the disclosed concepts.

Figure 2:
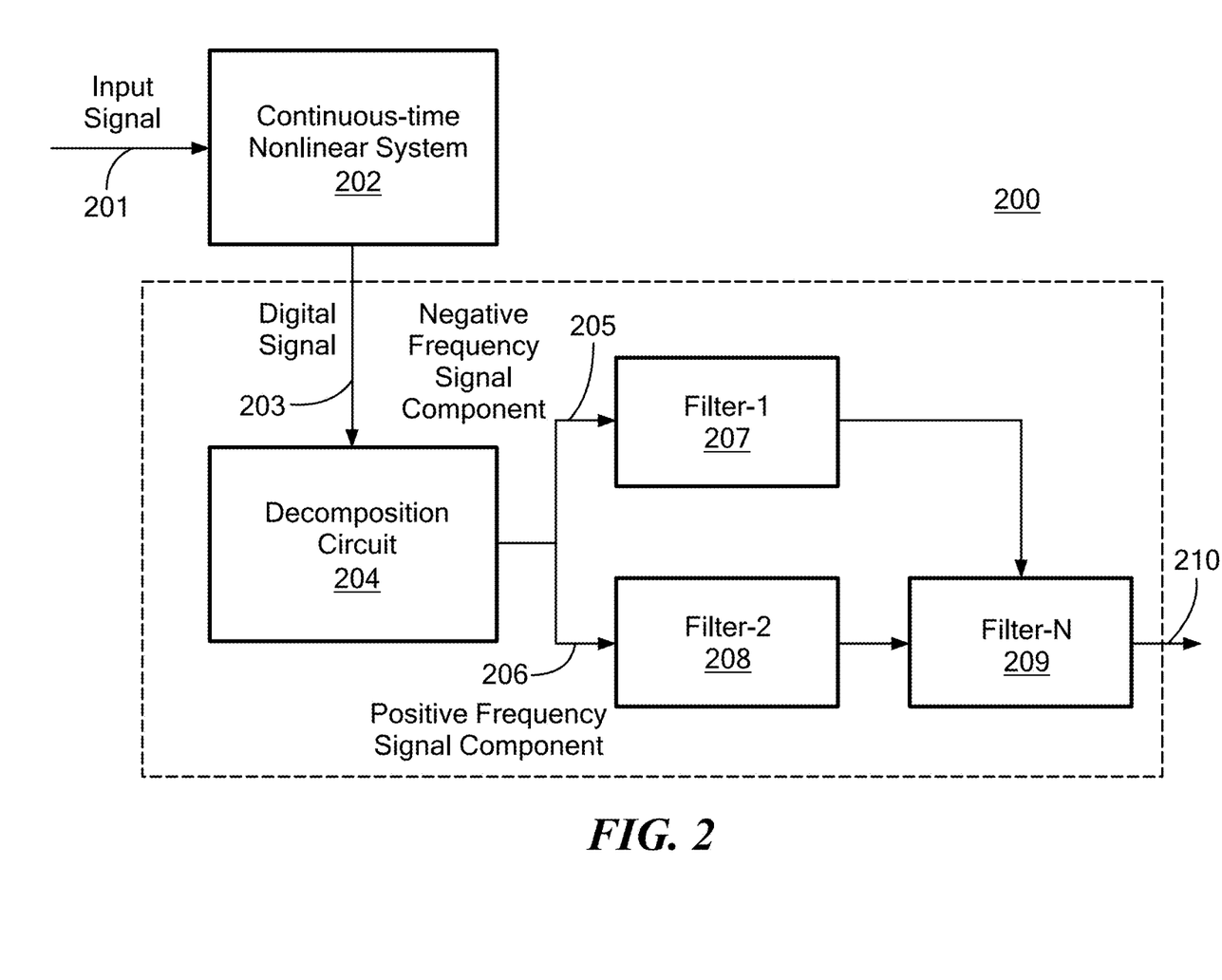
FIG. 2 is a block diagram of a digital compensator according to the concepts described herein.

Referring now to FIG. 2, the illustrative embodiment of a nonlinear compensator 220 may include a decomposition unit 204 and a plurality of filters 207, 208, 209. As shown in FIG. 1, input signal 201 is processed by a continuous-time nonlinear system 202. The continuous-time nonlinear system 202 may include input modifiers, device-under-test, and output modifiers as in FIG. 1. The intermediate signal 203 may include distortion from the DUT of the continuous-time nonlinear system 202.

Figure 2A:
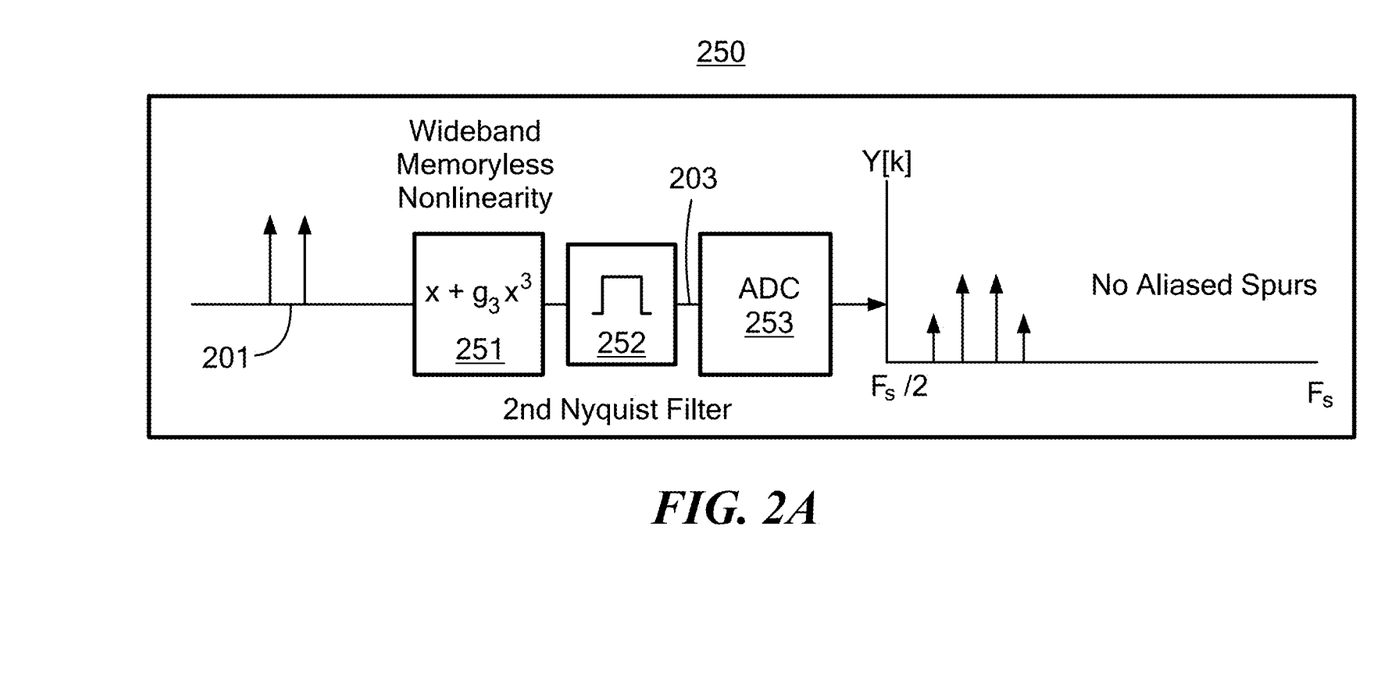
FIG. 2A is a block diagram of a continuous-time nonlinear system which the digital compensator in FIG. 2 matches.

For example, as shown in FIG. 2A, a continuous-time nonlinear system 202 may include a linear bandpass filter 251 placed in front of a static nonlinearity block 252 and then sampled by an analog-to-digital converter 253. The bandpass filter 251 may define the input frequencies that the system supports. Due to the bandpass filtering, only intermodulation distortion may be present, while higher order spurs corresponding to the sum products of the tones (harmonic distortion) are filtered out as well as any intermodulation products that fall out of the input bandwidth of interest. The lack of harmonic distortion and out of band intermodulation related spurs may impart significant nonlinear memory into the system.

However, as can be appreciated by those of ordinary skill in the pertinent art, distortion or nonlinearity in the intermediate signal may be introduced through other ways.

Referring now back to FIG. 2, the intermediate signal 203 coming from the continuous-time nonlinear system 202 may be converted by the decomposition circuit 204 into a corresponding complex representation of a negative frequency signal component 205 and a positive frequency signal component 206. This decomposition is in order to facilitate nonlinear compensation in a bandpass representation. The decomposition may be done digitally using at least one long memory filter. The long memory filter is a particular type of filter having many delays of finite impulse response (FIR) taps in a range of 20 to hundreds taps. In contrast, a short memory filter has 1-5 taps. In the actual implementation, there may be various ways of implementing decomposing digital signals using a long memory filter. For example, the decomposing circuit may be implemented using a Hilbert filter, which is a specific form of a long memory filter that provides Hilbert transformation. In another embodiments, the decomposing circuit may be implemented as a quadrature down-conversion circuit in analog or digital. The quadrature down-conversion circuit may be followed by a sharp low pass filter, which is another type of a long memory filter. In some embodiments, an optional decimator may be appended after the low pass filter. The combination of the quadrature down-conversion circuit, a sharp low pass filter and an optional decimator provides function of decomposing an input digital signal into positive and negative frequency components corresponding to the input signal. However, the decomposition may be done in any other methods or technologies available, as can be appreciated by those of ordinary skill in the pertinent art. The decomposition unit described herein may be implemented in Application-Specific Integrated Circuit (ASIC), programs executed on programmable processor, or as can be appreciated by those of ordinary skill in the pertinent art, by any methods available.

The negative frequency signal 205 and the positive frequency signal 206 may be processed by a plurality of filters 207, 208, 209. In this illustrative example, the negative frequency signal 205 is processed by Filter-1 207 and the positive frequency signal 206 is processed by Filter-2 208 and Filter-N 209. However, as can be appreciated by those of ordinary skill in the pertinent art, the negative frequency signal 205 and the positive frequency signal 206 may be processed by any combination of filters respectively. After processed by the plurality of filters, the output signal may have less nonlinear distortion than the intermediate signal 205. The plurality of filters may be a combination of one or more nonlinear operations and/or one or more linear combination filters. The nonlinear operation is usually a static mathematical operation, examples of which are as multiplication or squaring. The linear operation filter may be a static operation filter or an adaptive linear filter. An adaptive linear filter may perform different operation depending on the input signal to the filter The application of the appropriate cascade of static nonlinear operation filters and linear operation filters on the complex signal via complex filters is to implement the memory elements. The plurality of filter elements may reduce the number of tones to fully characterize the nonlinear system. This inventive concept will be explained in detail with the following examples.

Figure 3:
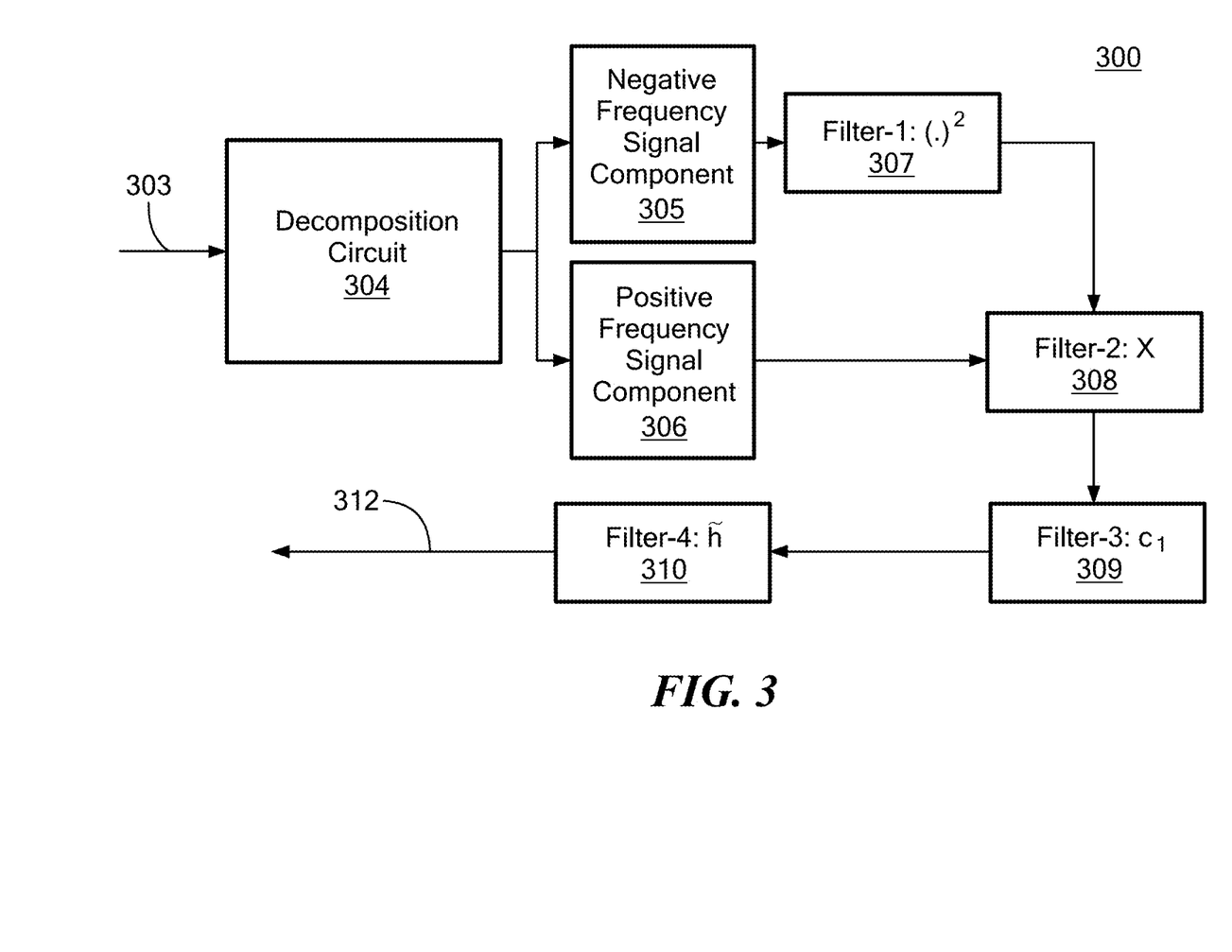
FIG. 3 is a block diagram of a first illustrative embodiment of an efficient compensator according to the concepts presented herein.

Referring now to FIG. 3, a block diagram of a first illustrative embodiment of an efficient compensator according to the concepts presented herein is shown. In FIG. 3, a decomposition circuit 304 in a compensator structure 300 may receive an intermediate signal 303 coming from a continuous-time nonlinear system. The decomposition circuit 304 may convert intermediate signal 303 into its positive and negative frequency components 305, 306. When the positive and negative frequency components are represented as $\tilde{y}_+$, $\tilde{y}_-$, the intermodulation effect may be then created by a plurality of filters 307, 308 representing an operation of $\tilde{y}_+$, $\tilde{y}_-^2 = \tilde{y}_-|y_-|^2$. Then the signal may be scaled via another filter performing a scaling circuit 309 that has a single coefficient $c_1$. The out of band intermodulation rejection may be then modeled by a further application of a filter 310 having a filter characteristic described by $\tilde{h}_-$ to the product. A filter having characteristic of $\tilde{h}_-$ is a negative frequency filter, which extracts just the negative frequencies from the signal. Herein, the characteristics of the plurality of filter elements 307, 308, 309, 310 are matched to a nonlinear frequency response of the decomposition circuit using the methods described in detail in FIGS. 6-10 and corresponding paragraphs.

The equalizer described above may implement the equivalent of thousands of Volterra kernel coefficients using only two fixed filters describing the bandpass filter and a single coefficient describing the nonlinearity. The static nonlinearity can be characterized by testing the nonlinear response of the system for a single two-tone combination.

Figure 4:
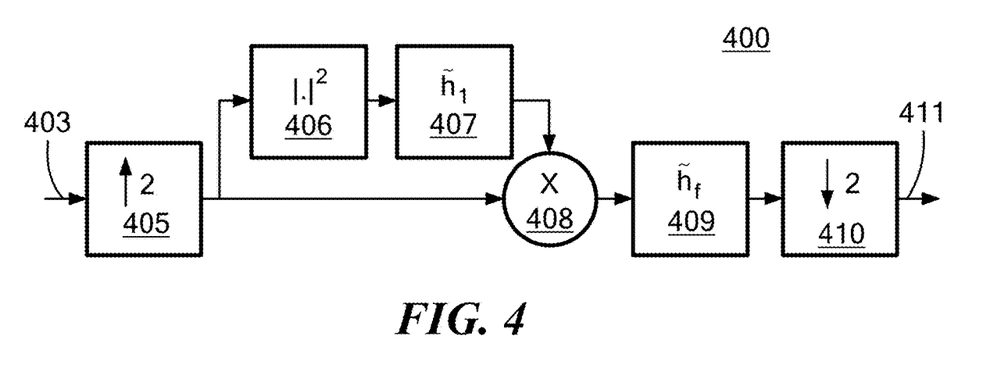
FIG. 4 is a block diagram of a second illustrative embodiment of an efficient compensator according to the concepts described herein.

Referring now to FIG. 4, a block diagram of a second illustrative embodiment of an efficient compensator according to the concepts presented herein is shown. This compensator structure may match with an equalizer for a direct sample ADC implementing a fully digital receiver. In the fully digital receiver, the signal is directly sampled at many GHz via samplers which may, be provided as an ADC (i.e. a direct sample ADC is used in implementing the fully digital receiver), converted to in-phase and quadrature components through digital down conversion, where it is then band-pass filtered and decimated to create the complex IF output.

With the compensator structure 400 in FIG. 4, now the complex signal created through a decomposition unit 405 is interpolated by a factor of two (see box 406) then input into a chain of static nonlinear operation filters 406, 409 and adaptive linear filters 407, 409 $\tilde{h}_1$ and $\tilde{h}_f$ matched to the receiver structure. The first linear operation filter 407 having characteristic of $\tilde{h}_1$ may be a high pass filter that passes signals with a frequency higher than a certain cutoff frequency and attenuates signals with frequencies lower than the cutoff frequency. The second operation linear filter 409 having characteristic of $\tilde{h}_f$ may be a low pass filter that passes signals with a frequency lower than a certain cutoff frequency and attenuates signals with frequencies higher than the cutoff frequency. The nonlinear operation filters 406, 408 are static operation filters since the filters always square an input signal or combine input signals respectively. These filter responses are found through analysis of the response of the system to multi-tone inputs. That is, the characteristics of the high pass filter and the low pass filter 407, 409 are matched to a nonlinear frequency response of the decomposition circuit. Since two linear filters are sufficient to characterize the response, they may be found via two sweeps of a two-tone input: One a sweep for spur output frequency and a second sweep for tone separation frequency.

Figure 5:
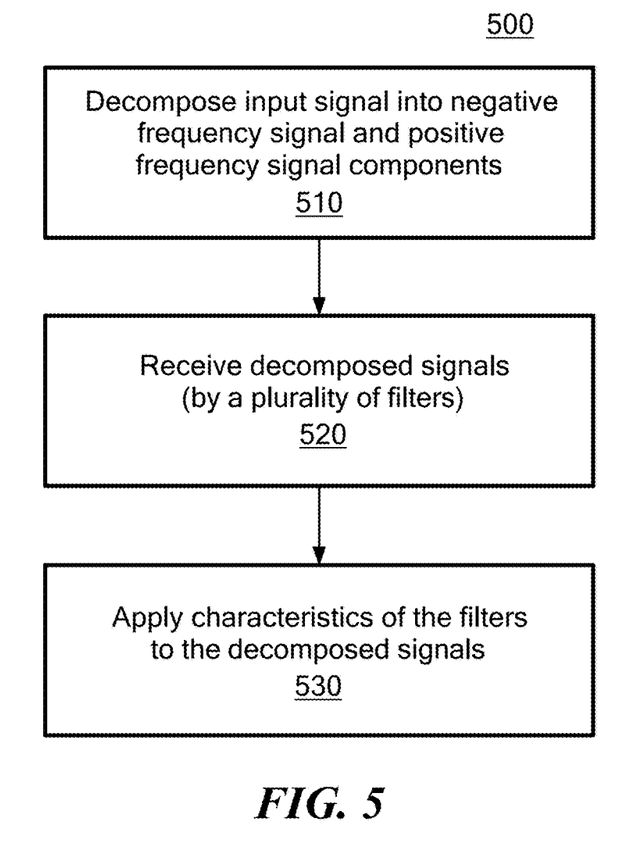
FIG. 5 is a flowchart of compensating non-linear signal according to the concepts described herein.

Referring now to FIG. 5, a flowchart 500 of an example of compensating non-linear signal is described. In step 510, an input signal from a continuous-time nonlinear system is decomposed by a decomposition circuit into a corresponding complex representation of a negative frequency signal and a positive frequency signal. In step 520, a plurality of filters receives at least portions of the decomposed negative frequency signal and positive frequency signal. Number of filters for negative frequency signal and positive frequency signal respectively may vary depending on the type of the continuous-time nonlinear system and desired characteristics of nonlinearity. In step 530, characteristics of the plurality of filters are applied to the decomposed negative frequency signal and positive frequency signal.

The functions described herein (e.g., process 500) is not limited to use with any specific hardware and software; they may find applicability in any computing or processing environment and with any type of machine or set of machines that is capable of running a computer program. The processes described herein may be implemented in hardware, software, or a combination of the two. The processes described herein may be implemented in Application-Specific Integrated Circuit (ASIC) or computer programs executed on programmable computers/machines that each includes a processor, a non-transitory machine-readable medium or another article of manufacture that is readable by the processor (including volatile and non-volatile memory and/or storage elements), at least one input device, and one or more output devices. Program code may be applied to data entered using an input device to perform any of the processes described herein and to generate output information.

The nonlinear higher order frequency response (HOFR) for selecting an appropriate nonlinear compensator structure will be described in detail with an example.

The memory effect of bandpass filters on required nonlinear compensators will next be described.

Figure 6:
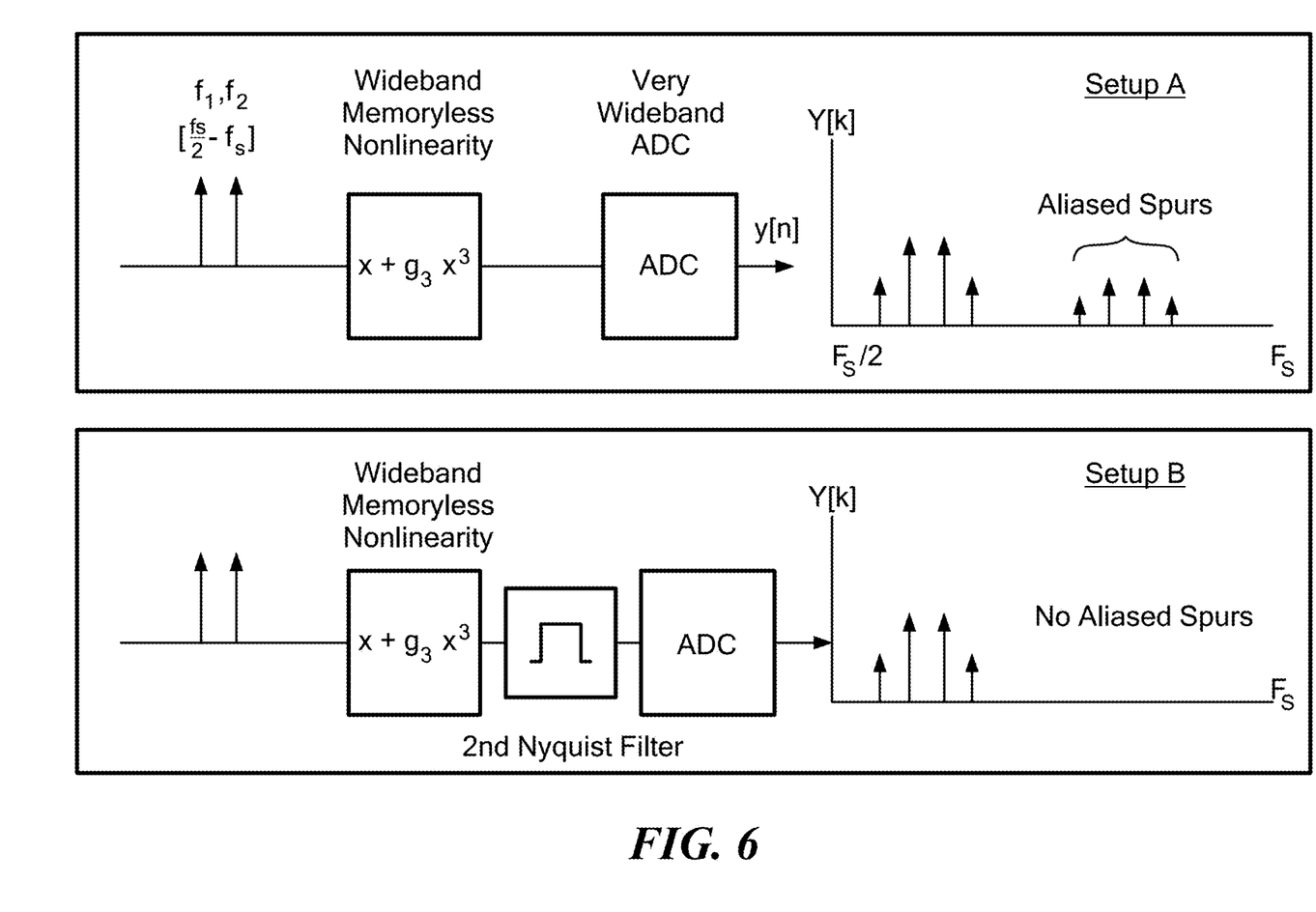
FIG. 6 illustrates a comparative example illustrating the effect of bandpass filters on required memory of Volterra compensators.

Considering two systems in FIG. 6, a static third order nonlinear system $g(x)=x+g_3x^3$ may be characterized by a wideband ADC in its second Nyquist zone where the input frequencies are chosen so that $$f_i \in \left[\frac{f_s}{2}, f_s\right].$$

In setup A, g(.) is directly connected to the ADC which for simplicity is assumed to be an ideal sampler. In setup B, the g(.)'s output is first connected to an ideal bandpass filter before being sampled by the ADC.

The $3^{rd}$ order HOFR and required Volterra time-domain compensators are extracted via the procedure given in Section II (FIG. 7) for $N=2^{14}$ and $f_s=160$ MHz. The HOFR of setup A is proportional to $g_3$ and homogenous throughout the entire domain, while the HOFR of setup B exhibits both constant valued regions and regions of zero value as well as sharp transitions between those regions. Due to the 3-IDFT relationship between the HOFR and Volterra kernel, one would expect that the time-domain compensator for setup A would be exceptionally simple while being much more complicated for setup B. One can see that setup A requires a single Volterra coefficient for compensation, while setup B contains 2500 Volterra coefficients within 50 $dB_{max(|k_3|)}$, despite the nonlinearity being determined simply by a scalar parameter $g_3$ in the physical system. This illustrates a fundamental inefficiency of any compensator that directly performs Volterra kernel calculations without regard to the physical system's structure as a single underlying physical nonlinearity parameter can simultaneously influence many Volterra kernel coefficients. The above kernel extractions show setup A is a system that is far easier in terms of nonlinear memory to compensate than setup B despite exhibiting many more spurs aliasing into $[0, f_s]$ due to the lack of bandpass filter.

Figure 8:
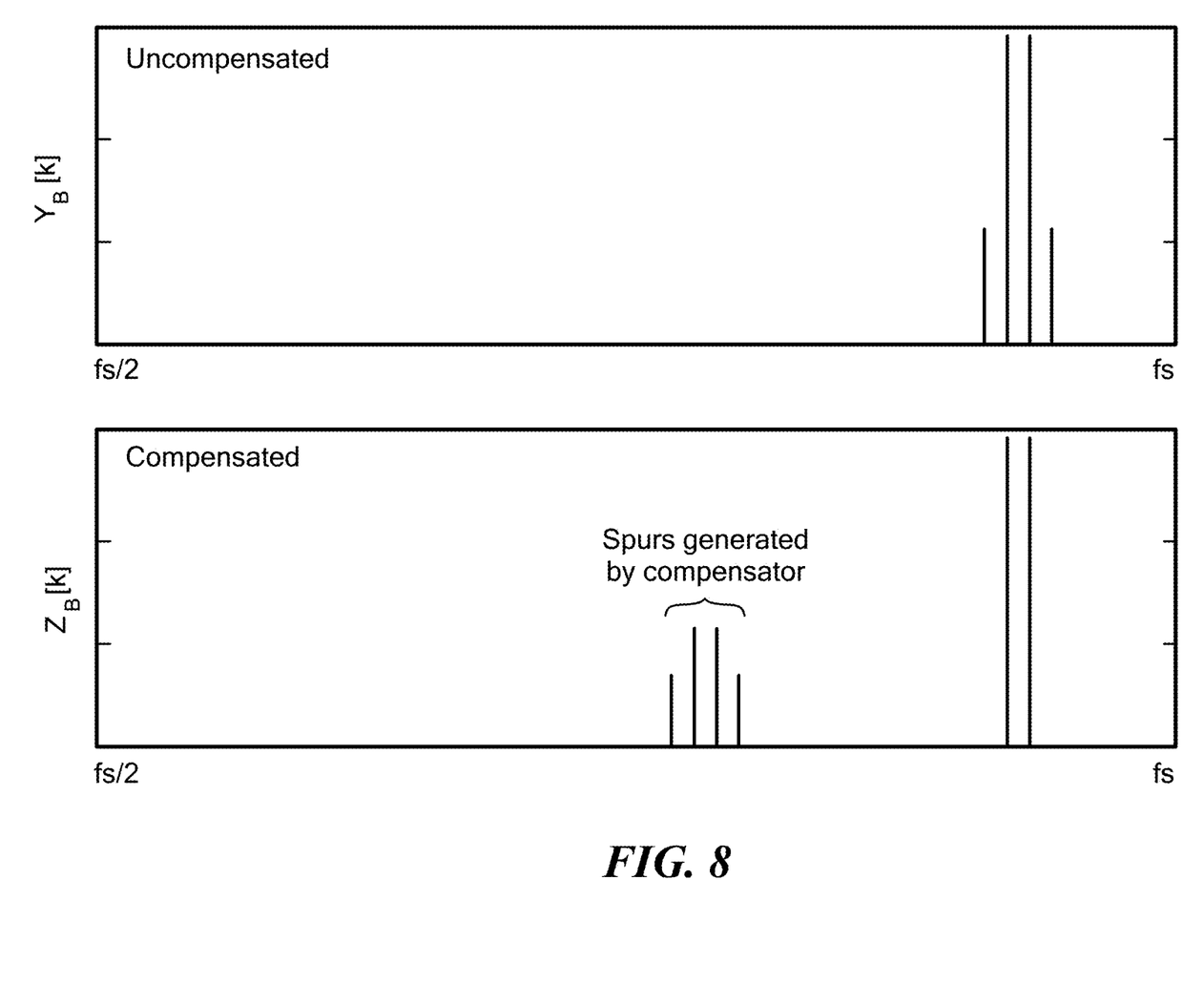
FIG. 8 illustrates application of a Taylor equalizer to a two-tone stimulus in setup B of FIG. 6.

Applying a single coefficient (Taylor) equalizer to setup B illustrates the reason such a large amount of nonlinear memory is needed in the compensator (FIG. 8). The equalizer efficiently cancels spurs that are already present in the record for setup B while generating all spurs that were eliminated due to the presence of the band-pass filter. One may conclude that the role of nonlinear memory in the required Volterra kernel of setup B is to prevent generation of nonlinear spurs that were already physically eliminated through the bandpass filter. Intuitively, this must be done through an appropriate "interference pattern" of many nonlinear memory elements, as any single Volterra kernel coefficient $\tilde{k}_{m_1 m_2 m_3}$ generates output spurs at all harmonic combinations of the input data with constant magnitude scaled by $C_{k_1 k_2 k_3}$.

The details for deriving a Hilbert Compensator for the purposes described herein will next be described.

Detailed examination of the required HOFR response (FIG. 6) of compensator $\tilde{K}_{3,B}$ for setup B shows the influence of the bandpass filter as well as provides hints for the structure of an efficient compensator. It is noticed that:

$$\tilde{K}_{3,B}[k_1 \ldots k_3] = 0 \forall k_1, k_2, k_3 > 0 \quad (1)$$

Figure 9:
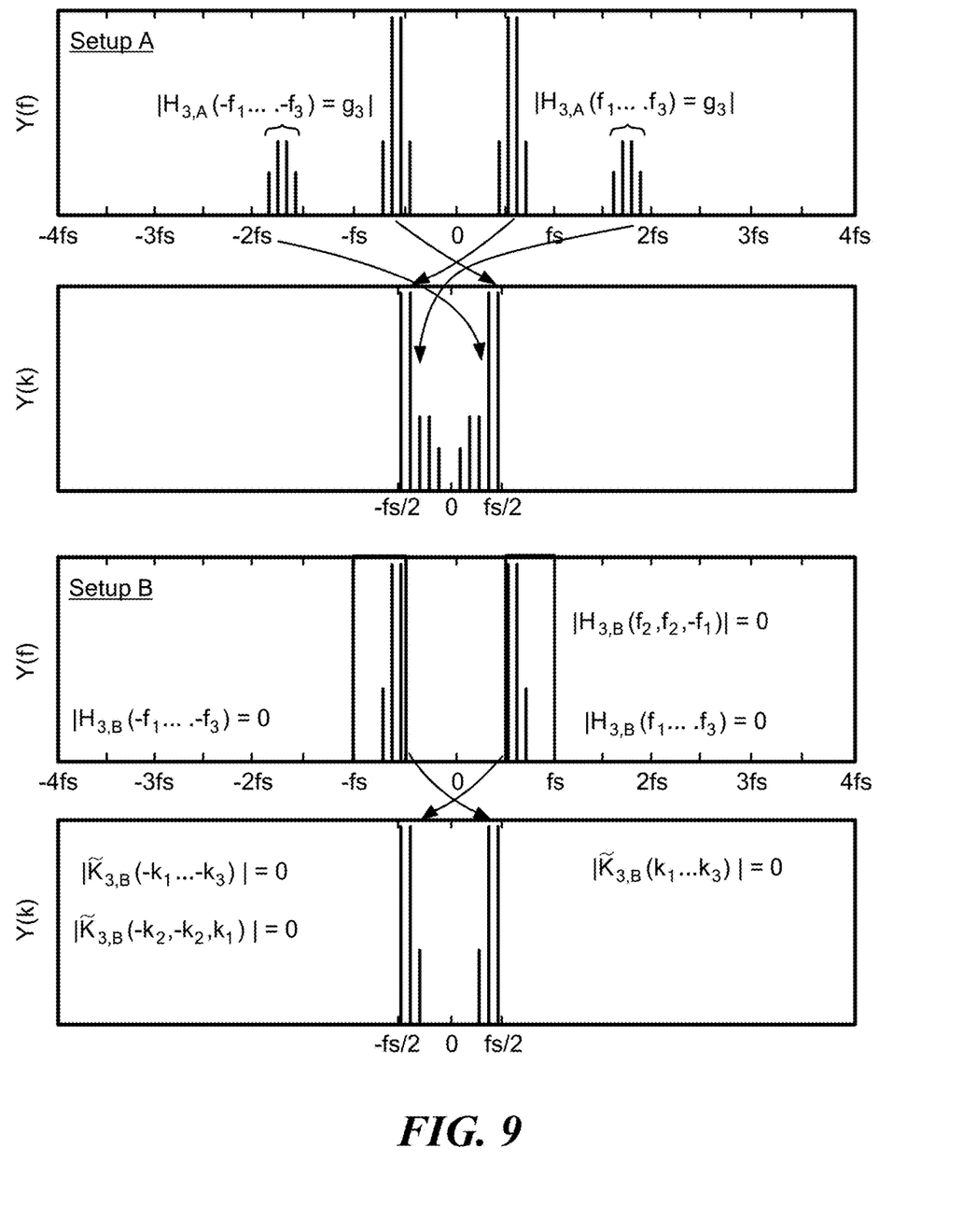
FIG. 9 illustrates source of differences in the HOFR for setup A and setup B of FIG. 6.

This may show that spurs corresponding to combinations of three positive discrete frequencies are not present in setup B. This can be understood by realizing that when the continuous time input is given in second Nyquist, the positive discrete frequencies $k_1$, $k_2$, $k_3 > 0$ correspond to negative real frequencies $f_1$, $f_2$, $f_3 < 0$ (FIG. 9). The output spur associated with the continuous time system $H_{3,B}(f_1 \ldots f_3)$ encompassing both $g(.)$ and the output bandpass filter can be seen to fall at $$-3f_s < f_o = f_1 + f_2 + f_3 < -3\frac{f_s}{2}$$

and is thus filtered out by the second Nyquist bandpass filter, which selects frequencies $$f_o \in \pm\left[\frac{f_s}{2}, f_s\right].$$

Additionally from the HOFR in regions $k_1 \ldots k_3$ where two k indexes are negative (this may be referred to as the intermodulation region), diagonal planes of transition from passband to stopband behavior may be observed. This is attributable to further bandpass filtering after intermodulation. In the continuous time system $H_{3,B}$ if the sum of two positive and one negative $f_i$ falls in the range of $$\frac{f_s}{2} < f_o < f_s$$

then $H_{3,B}(f_1 \ldots f_3) = g_3$ while otherwise $H_{3,B}(f_1 \ldots f_3)$ is zero (FIG. 9).

The emphasis on the importance of positive and negative frequency combinations in the HOFR of compensator $\tilde{K}_{3,B}$ motivates decomposing the input $y[n]$ into complex components $\tilde{y}_+[n]$ and $\tilde{y}_-[n]$ containing only positive and negative frequency components as follows:

$$\tilde{y}_+[n] = \frac{1}{2}(y[n] + j \, hil[n] * y[n]) = \tilde{h}_+[n] * y[n] \quad (2)$$

$$\tilde{y}_-[n] = \frac{1}{2}(y[n] - j \, hil[n] * y[n]) = \tilde{h}_-[n] * y[n]$$

where $hil[n]*y[n]$ denotes convolution between a Hilbert filter and $y[n]$. The Hilbert filter frequency response is given as follows:

$$Hil(k) = -j, \quad 0 < k < \frac{N}{2} \quad (3)$$

$$Hil(k) = +j, \quad \frac{N}{2} < k < N$$

$\tilde{h}_+[.], \tilde{h}_-[.]$ defined as above are complex filters that isolates positive and negative frequencies.

It can clearly be seen that $y[n] = \tilde{y}_+[n] + \tilde{y}_-[n]$. If one observes the response of $y[n]^3$ in these components it is found:

$$y[n]^3 = 2Re(\tilde{y}_-[n]^3 + 3\tilde{y}_-[n]^2\tilde{y}_+[n]) \quad (4)$$

One can see that $\tilde{y}_-[n]^3$ solely creates harmonic components associated with the mixing of three negative discrete frequencies while $\tilde{y}_-[n]^2\tilde{y}_+[n]$ creates harmonics associated with the mixing of two negative and one positive discrete frequency. These physically correspond to the mixing of three positive continuous frequencies (harmonic distortion) and the mixing of two positive and one negative frequency (intermodulation) in the continuous system $H_{3,B}(f_1 \ldots f_3)$. Thus, to generate a compensator which only has response at the intermodulation frequencies, one may simply omit the $\tilde{y}_-[n]^3$ component from the compensator.

Figure 7:
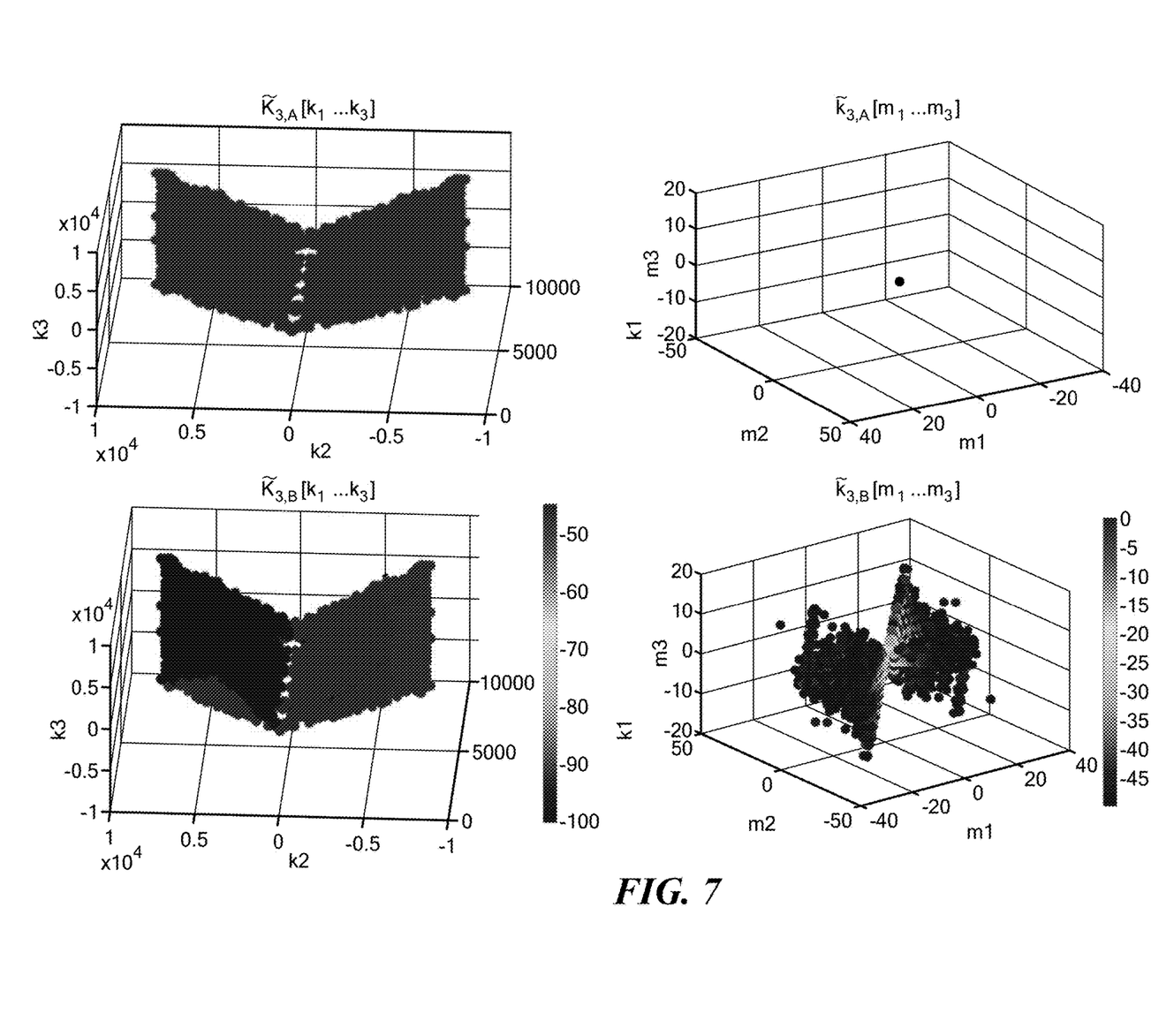
FIG. 7 illustrates a higher order frequency response (HOFR) and required time domain Volterra compensator for setup A and setup B of FIG. 6.

The additional output filtering effect seen by the diagonal transition in the intermodulation region of $\tilde{K}_{3,B}[k_1 \ldots k_3]$ (FIG. 7) can be obtained by noting that if the discrete frequencies generated by the operation $\tilde{y}_-[n]^2\tilde{y}_+[n]$ fall outside the range of $$k_o \in \left[\frac{N}{2}, N\right]$$

then it corresponds physically to the output spurs from continuous system $H_{3,B}$ falling outside the range of $$f_o \in \left[\frac{f_s}{2}, f_s\right]$$

and thus an additional application of $\tilde{h}_-[.]$ is required after nonlinear spur generation. The efficient second Nyquist compensator output for the system of setup B can thus be shown to be:

$$y_c[n] = 2Re(\tilde{h}_-[n] * (3g_3\tilde{y}_-[n]|\tilde{y}_-[n]|^2)) \quad (5)$$

where it is noted that $y_+[n] \, y_-[n] = |y_-[n]|^2$.

Figure 10:
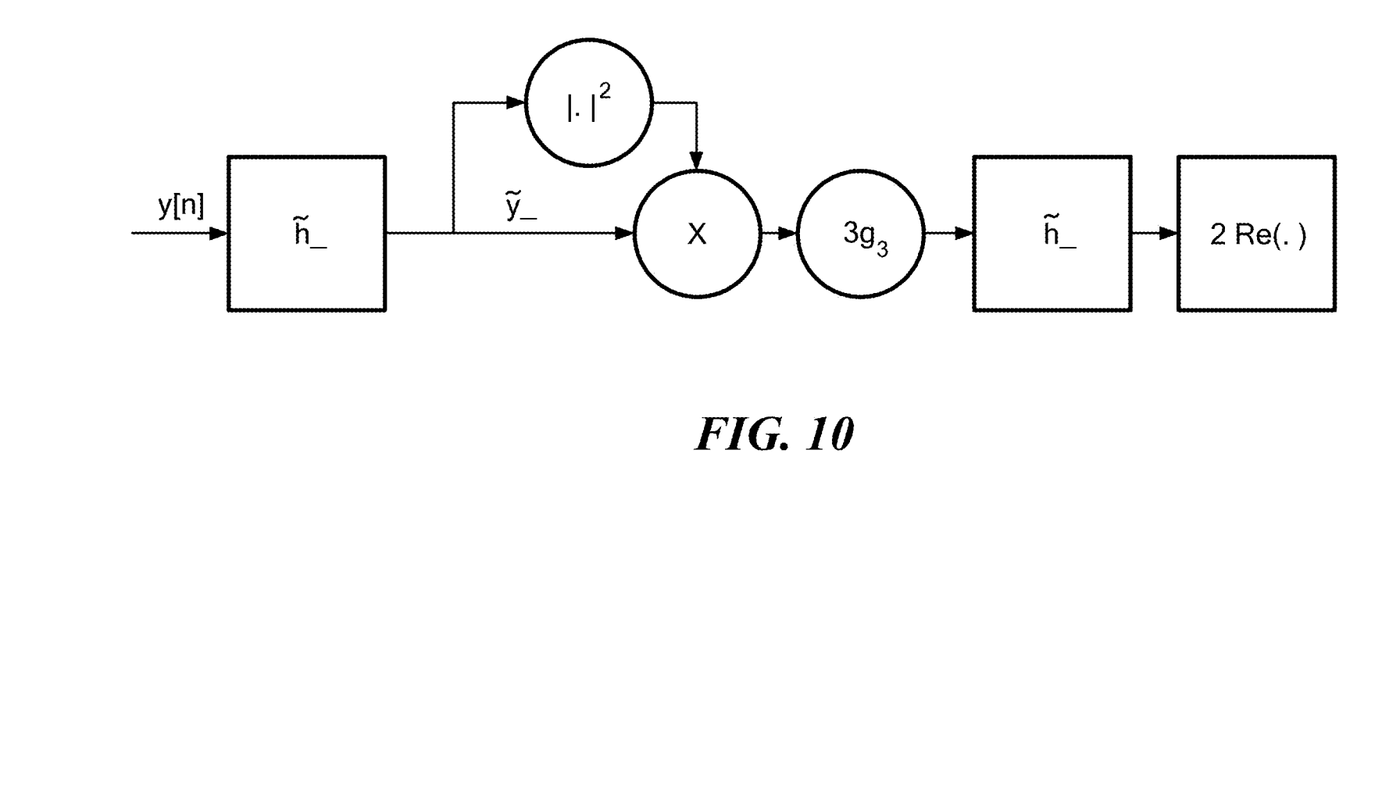
FIG. 10 illustrates a structure of an Hilbert compensator for setup B of FIG. 6.

The required compensator structure is shown in FIG. 10. With respect to [n], the nonlinear compensator has a linear filter-memoryless nonlinearity-linear (LNL) filter structure which is not identifiable through least squares methods [1]. However, with respect to the transformed quantity $\tilde{y}_-[n]$ the compensator is Hammerstein and thus is linear in coefficients. Eq. (5) can be recognized as a memory polynomial to those familiar with digital-predistortion (DPD) [1]. However in DPD, the available data is already complex (since it is the envelope to be modulated on a carrier), whereas in this example the real signal y[n] is decomposed into complex components to facilitate compensation, an insight that is not readily apparent without the insights gained from HOFR analysis.

The compensator structure of Eq. (5) is physically satisfying in that it only has one underlying nonlinearity parameter, much like the physical system. The nonlinear Volterra memory required in FIG. 7 is implemented through the memoryless multiplication operation of $\tilde{y}_-[n] |\tilde{y}_-[n]|^2$ after application of the negative frequency filter $h_-[.]$ on the input y[n] as well as through output filtering of $3g_3\tilde{y}_-[n]|\tilde{y}_-[n]|^2$ by $h_-[.]$. Since $\tilde{h}_-[.]$ involves a Hilbert transform, it is a linear filter whose impulse response in principle is non-zero valued at all odd indices. Subsequent memoryless nonlinear operations expand the memory of $\tilde{h}_-[.]$ efficiently into higher dimensional Volterra space.

Any receiver system requiring linearity can make use of these techniques. Such a technique finds use in applications including, but not limited to, radar, SIGINT, COMMINT, and commercial wireless that can utilize the improved digital nonlinearity compensation structures shown here. The proposed technique also finds application in systems in which digital linearity enhancement techniques for receivers in an array are necessary.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Accordingly, other embodiments are within the scope of the following claims.

I claim:

1. A nonlinear compensator comprising:
    a decomposition circuit having a nonlinear frequency response characteristic, the decomposition circuit being configured to receive an input signal and decompose the input signal provided thereto into decomposed positive and negative frequency signal components of the input signal; and
    a filter circuit coupled to the decomposition circuit and configured to receive the decomposed positive and negative frequency signal components from the decomposition circuit, the filter circuit comprising a plurality of filter elements having frequency response characteristics matched to the nonlinear frequency response characteristic of the decomposition circuit, with at least a first one of the plurality of filter elements configured to receive negative frequency signal components and at least a second, different one of the plurality of filter elements configured to receive positive frequency signal components, wherein, in response to the decomposed positive and negative frequency signal components provided to the respective filter elements, the plurality of filter elements apply the filter element frequency response characteristics to the respective decomposed positive and negative frequency signal components such that a signal output from the plurality of filter elements has less nonlinear distortion than the input signal to the decomposition circuit;
    wherein the plurality of filter elements includes a chain of nonlinear operation filters and linear operation filters with at least one of the nonlinear operation filters configured as a static operation filter and with the linear operation filters including a high pass filter and a low pass filter.

2. The nonlinear compensator of claim 1, wherein the plurality of filter elements is configured to reduce a number of tones needed to characterize a continuous-time nonlinear system to which the decomposition circuit is coupled.

3. The nonlinear compensator of claim 1, wherein at least one of the nonlinear operation filters comprises at least one static nonlinear mathematical operation element.

4. The nonlinear compensator of claim 1, wherein at least one linear operation filter comprises at least one of:
    at least one static linear filter; or
    at least one adaptive linear filter.

5. The nonlinear compensator of claim 1, wherein the decomposition circuit comprises at least one long memory filter.

6. The nonlinear compensator of claim 5, wherein the long memory filter is a Hilbert filter to decompose the input signal into the decomposed signals.

7. The nonlinear compensator of claim 5, wherein the at least one long memory filter having a low pass filter characteristic to decompose the input signal into the decomposed positive and negative frequency signal components.

8. The nonlinear compensator of claim 7, wherein the decomposition circuit further comprises a decimator.

9. The nonlinear compensator of claim 1, wherein the decomposed positive and negative frequency signal components are interpolated by a fractional factor F, where F is a fraction greater than 1.

10. The nonlinear compensator of claim 1, wherein the decomposed positive and negative frequency signal components are decimated by a fractional factor F, where F is a fraction greater than 1.

11. A method for compensating signals, the method comprising:
    receiving an input signal from a nonlinear system;
    decomposing, by a decomposition circuit having a nonlinear frequency response characteristic, the input signal into decomposed positive and negative frequency signal components of the input signal;
    receiving the decomposed positive and negative frequency signal components, by a plurality of filter elements having frequency response characteristics matched to the nonlinear frequency response characteristic of the decomposition circuit, wherein negative frequency signal components being received by a first one of the first one of the plurality of filter elements and positive frequency signal components being received by a second, different one of the plurality of filter elements; and
    applying the filter element frequency response characteristics of the decomposed positive and negative frequency signal components such that an output signal from the plurality of filter elements has less nonlinear distortion than the input signal;
    wherein the plurality of filter elements includes a chain of nonlinear operation filters and linear operation filters; at least one of the nonlinear operation filters configured as a static operation filter, the linear operation filters including a high pass filter and a low pass filter.

12. The method of claim 11, further comprising reducing the number of tones to characterize the nonlinear system by the plurality of filter elements.

13. The method of claim 11, further comprising interpolating the decomposed positive and negative frequency signal components by a fractional factor F, where F is a fraction greater than 1.

14. The method of claim 11, further comprising decimating the decomposed positive and negative frequency signal components by a fractional factor F, where F is a fraction greater than 1.

15. A receiver system, the receiver system comprising:
a continuous-time nonlinear system that processes an input signal and produces an intermediate signal, wherein the intermediate signal is a digital signal;
a decomposition circuit configured to receive the intermediate signal and having a nonlinear frequency response characteristic to an input signal provided thereto, said decomposition circuit configured to decomposes an input signal provided thereto into decomposed positive and negative frequency signal components of the input signal; and
a plurality of filter elements having frequency response characteristics matched to the nonlinear frequency response characteristic of the decomposition circuit, with at least a first one of the plurality of filter elements configured to receive negative frequency signal components and at least a second, different one of the plurality of filter elements configured to receive positive frequency signal components, and the plurality of filter elements further configured to apply the filter element frequency response characteristics to the decomposed positive and negative frequency signal components provided thereto such that an output signal from the plurality of filter elements has less nonlinear distortion than the input signal to the decomposition circuit;
wherein the plurality of filter elements includes a chain of nonlinear operation filters and linear operation filters, at least one of the nonlinear operation filters configured as a static operation filter, the linear operation filters including a high pass filter and a low pass filter.

16. The receiver system of claim 15, wherein the continuous-time nonlinear system comprises input circuitry, a device-under-test, and output circuitry.

17. The receiver system of claim 16, wherein the input circuitry comprises an input driver, a power combiner, a balun, or a filter.

18. The receiver system of claim 16, wherein the output circuitry comprises an output filter or an Analog-to-digital converter (ADC).

* * * * *